United States Patent
Patel et al.

(10) Patent No.: US 8,350,205 B2
(45) Date of Patent: Jan. 8, 2013

(54) OPTICAL RECEIVER COMPRISING BREAKDOWN-VOLTAGE COMPENSATION

(75) Inventors: Ketan Mukund Patel, Yardley, PA (US); Mark Allen Itzler, Princeton, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 443 days.

(21) Appl. No.: 12/787,696

(22) Filed: May 26, 2010

(65) Prior Publication Data

US 2010/0301194 A1    Dec. 2, 2010

Related U.S. Application Data

(60) Provisional application No. 61/181,080, filed on May 26, 2009.

(51) Int. Cl.
*G01J 1/42*    (2006.01)

(52) U.S. Cl. .......... 250/208.2; 250/214.1; 250/214 DC; 257/322; 257/438

(58) Field of Classification Search ............... 250/214.1, 250/214 R, 208.1, 214 DC, 208.2; 257/186, 257/431, 199, 322, 438, 481, 492, 493, 551, 257/603, E31.116, E31.063, E29.335, E21.335, 257/E21.357

See application file for complete search history.

(56) References Cited

U.S. PATENT DOCUMENTS

| | | | |
|---|---|---|---|
| 4,438,348 A | 3/1984 | Casper et al. | |
| 5,578,815 A * | 11/1996 | Nakase et al. | 250/214 R |
| 6,683,294 B1 * | 1/2004 | Herbert et al. | 250/214 R |
| 6,858,829 B2 * | 2/2005 | Nishimura et al. | 250/214 R |
| 7,217,914 B2 | 5/2007 | Stewart et al. | |

* cited by examiner

*Primary Examiner* — Francis M Legasse, Jr.
(74) *Attorney, Agent, or Firm* — Kaplan, Breyer, Schwarz & Ottesen, LLP

(57) ABSTRACT

The present invention enables the detection of light using an APD that has high gain and/or a wide range of operating temperature. A first APD is biased with a voltage bias that is controlled based on the breakdown voltage of a second APD, which is thermally coupled with the first APD. Changes in the breakdown voltage of the second APD due to aging, temperature chances, and the like, are reflective of changes in the breakdown voltage of the first APD. As a result, the first APD can be operated with greater stability and reliability at high gain and over larger temperature excursions than APDs known in the prior art.

20 Claims, 3 Drawing Sheets

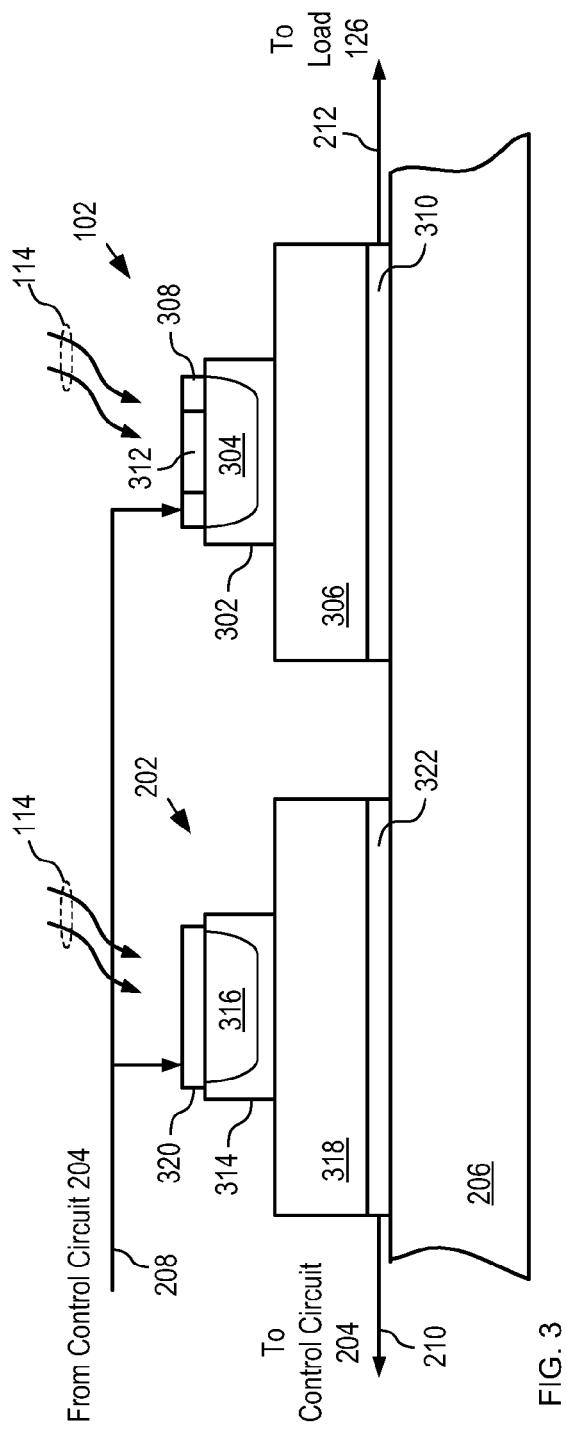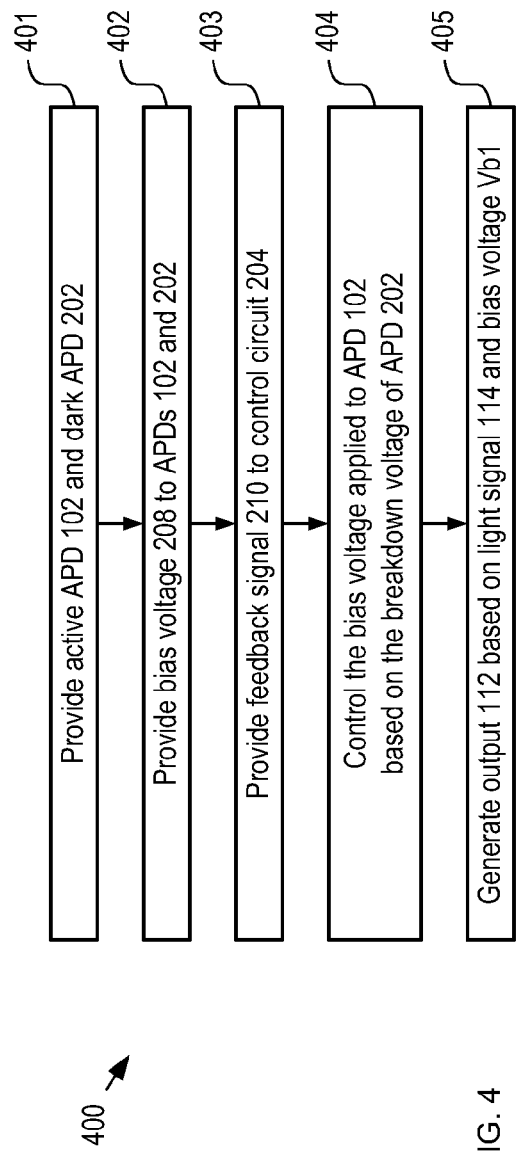

OPTICAL RECEIVER COMPRISING BREAKDOWN-VOLTAGE COMPENSATION

CROSS REFERENCE TO RELATED APPLICATIONS

This case claims priority of U.S. Provisional Patent Application U.S. 61/181,080, which was filed on May 26, 2009, and which is incorporated herein by reference.

FIELD OF THE INVENTION

The present invention relates to photodetectors in general, and, more particularly, to avalanche photodiodes.

BACKGROUND OF THE INVENTION

A semiconductor photodiode is a device that provides an electric current in response to the absorption of light. Photodiodes are used in myriad applications, such as optical communications applications, sensing applications, industrial control applications, and security applications.

A photodiode provides an electric current that is based upon a process known as "photo-absorption," in which the photodiode generates a free-carrier pair (an electron and a hole) when it absorbs a particle of light (i.e., photon). To generate a free-carrier pair, an incident photon having sufficient energy transfers its energy to an electron bound within the atomic lattice of a semiconductor. The increased energy of the electron enables it to release from its bound condition (leaving behind a hole) and freely move within the atomic lattice. A bias voltage applied across the photodiode induces an electric field that accelerates generated free-carriers pairs and gives rise to a macroscopic electric current, referred to as a "photocurrent." The magnitude of the photocurrent is proportional to the number of photons absorbed by the semiconductor.

Free-carrier pairs are also generated in the semiconductor due to absorption of thermal energy, which is directly proportional to the device temperature. Absorbed thermal energy can provide sufficient energy to a bound electron to liberate it and allow it to move freely, much in the same way that photon absorption liberates an electron. The thermal generation of free-carrier pairs is generally undesirable. It gives rise to an electrical current, referred to as "dark current." Dark current represents noise in the output of an optical receiver that can impair detection of photocurrent, which represents the signal to be detected.

Typically, a photodiode is part of an electrical circuit that is used to detect the photocurrent. For a photodiode to produce useful information, the photocurrent must not only significantly exceed the dark current but also any unwanted noise that might be present in the electronics. Such noise can be any combinations of, but not limited to, shot noise, Johnson noise, 1/F, etc. The amount of optical power that is required to produce a photocurrent equal to the total noise in the electronics is defined as the "sensitivity" of the photodiode.

To maximize sensitivity, it is necessary to maximize the number of free-carriers generated by photo-absorption. Unfortunately, by photo-absorption alone, a maximum of one free-carrier pair can be generated for each incident photon. Fortunately, to further enhance the sensitivity of the photodiode, a third means of generating free-carrier pairs, avalanche gain, can be introduced to some semiconductor photodiodes.

A photodiode that provides avalanche gain is called an avalanche photodiode (APD). APDs can have extremely high sensitivity. In fact, an APD can be made sensitive enough to detect even a single photon. Avalanche photodiodes are so named because the motion of free-carriers through the atomic lattice of a semiconductor gives rise to additional free-carriers—much like boulders rolling down a hill during an avalanche. This free-carrier "avalanche" results from impact ionization within a region of the APD called the "multiplication region."

Impact ionization occurs when free-carriers are accelerated to high energy by the applied electric field. As these accelerating free carriers travel through the multiplication region of the avalanche photodiode, they collide with carriers bound in the atomic lattice of the multiplication region. In each collision, some of the energy of the free carrier is absorbed by the bound carriers, freeing them from the atomic lattice. The newly freed carriers, as well as the previously generated free-carriers, are then accelerated once again by the electric field. This enables them to collide with, and liberate, more bound carriers. This process can occur very rapidly and efficiently and it is possible to generate several hundred million free-carriers from a single absorbed photon in less than one nanosecond.

The generation of free-carriers by impact ionization is parameterized by a "gain" or "multiplication" defined as the ratio of free-carriers generated with impact ionization as compared to free-carriers generated without impact ionization. Gain due to impact ionization is strongly dependent on the voltage applied across the multiplication region and applies, without prejudice, to both photocurrent and dark current.

In practice, however, it is difficult to directly measure gain. It is possible, however, to determine a bias voltage at which avalanche breakdown occurs. Avalanche breakdown is a condition in which free carriers are continuously and indefinitely generated in a self-sustaining manner in an APD without the presence of incident light. The bias voltage at which avalanche breakdown occurs is referred to as the "breakdown voltage" of the APD. Typically, the avalanche breakdown is approximated as the applied voltage that produces a certain level of multiplied, dark current.

It is well-known that the value of applied bias voltage, relative to breakdown voltage, determines the gain and/or operating mode of an APD. For linear-mode operation, an APD is biased with a bias voltage that is less than its breakdown voltage by a specified amount (an offset voltage). Gain increases exponentially as the offset voltage is reduced. For a constant offset voltage (at constant temperature), an APD operates with constant gain such that generated photocurrent is directly proportional to the intensity of light incident on the APD.

For Geiger-mode operation, an APD is biased with a bias voltage that is greater than its breakdown voltage. When biased above breakdown voltage, the gain of the APD has substantially infinite gain.

For proper operation of an APD in either linear or Geiger mode, therefore, precise and accurate knowledge of the breakdown voltage is essential. Unfortunately, the breakdown voltage for an APD, once fabricated, can vary for a number of reasons, such as temperature changes, device aging, variations in operating conditions, etc. Further, because the breakdown voltage is sensitivity to microscope changes in the properties and structure of the semiconductor in which the APD is fabricated, it is well-known that breakdown voltage will vary from device to device, wafer to wafer, and fabrication run to fabrication run due to variations in the product processes that are difficult to control.

Temperature variation affects the breakdown voltage of an APD by affecting the impact ionization rate in the semiconductor. Specifically, breakdown voltage increases with increasing operating temperature.

In addition, operation at high gains (e.g., >>10) is particularly challenging because the gain becomes increasingly sensitive to changes in bias voltage as the gain is increased. For example, when operating at high gain conditions, a change in bias voltage as small as 2% can affect a change in gain of 100% or more. In fact, an unanticipated shift in breakdown voltage or error in bias voltage can induce catastrophic failure or unacceptably large performance variation. Consequently, several challenges arise in both application and maintaining the APD bias for high gains.

First, where high-gain APD are to be employed, there requires precise knowledge of the APD breakdown voltage from device to device. This entails careful measurement of 100% of the APD devices to be used. Moreover, it requires proper configuration or calibration of the system in which the APD is to be incorporated such that the bias voltage is accurately set. While neither are unachievable processes, in practice, they are difficult and time consuming to implement and incompatible for either high-volume or low-cost processes. As a result, therefore, the breakdown voltage of an APD considered to be representative is commonly used as the bias voltage for all systems, regardless of the specific APD device used.

Second, regardless of whether the APD bias voltage can be accurately set at the begin of life of any system employing the APD, the dependence of breakdown voltage on external factors, particularly operating temperature, requires a system that continuously maintains the appropriate bias voltage over the life of the system. As a result, the value of the breakdown voltage at an operating temperature, as well as its variation over temperature must be accurately and precisely known—especially in applications requiring high APD gain. Unfortunately, individually characterizing the temperature dependence on a device-to-device basis is extremely costly and time consuming.

One commonly employed, low-cost strategy for mitigating the risks of error or variation in the bias voltage with respect to breakdown voltage is to operate APDs using a large offset voltage. This reduces any inaccuracy in the breakdown voltage relative to the increased offset voltage. Further, this also reduces the sensitivity of gain to offset voltage variation by virtue of the exponential relationship of gain to bias voltage. Still further, this mitigates the risk of the bias voltage becoming larger than the breakdown voltage, which can cause catastrophic failure for an APD-based system intended for operation in the linear-mode. However, such risk mitigation is attained at the expense of operating performance, namely sensitivity.

Another common method for enabling improved high-gain APD operation is to operatively couple the APD with a temperature compensation circuit. Compensation circuits have been developed that adjust bias voltage in response to changes in breakdown voltage due to temperature changes. This requires an ability to accurately detect a shift in the breakdown voltage of the APD, however. During normal operation, it is not typically possible to directly measure the breakdown voltage of the APD. In lieu of direct measurement, therefore, the temperature of the APD is commonly used to infer a value for the breakdown voltage. The temperature of the APD is estimated from the temperature of the carrier (monitored using a temperature sensitive element, such as a thermistor, thermocouple, Schottky diode, etc.) on which the APD is disposed. This temperature is then used, along with a predetermined model of the relationship between temperature and breakdown voltage, to calculate a value for the breakdown voltage of the APD. Such an approach offers no relief for breakdown voltage variation due to changing operating conditions, however. The effectiveness of such a method is also limited by the accuracy of the predetermine model of the breakdown voltage with respect to temperature.

SUMMARY OF THE INVENTION

The present invention provides an APD-based optical receiver without some of the costs and disadvantages of the prior art.

In many applications, the breakdown voltage of an APD cannot be measured directly without interrupting the operation of the system in which is it used. For many applications, such interruption is not acceptable. The present invention enables a means of maintaining precise knowledge of the breakdown voltage of an APD being used to receive optical signals without direct measurement of the APD. The present invention monitors the breakdown voltage of a first APD and the uses of this breakdown voltage to control the bias voltage of a second APD so that the second APD can be reliably operated with higher gain and/or operated over a wider temperature range than achievable in the prior art. Embodiments of the present invention are particularly well-suited for use in optical receivers, focal plane arrays, optical instruments, telecommunications networks, and metrology equipment.

In some embodiments, a pair of APDs is integrated into a single package. The first APD receives input light and provides an electrical signal based on the received light. The second APD is used to provide a measurement of its breakdown voltage. The first and second APDs are thermally coupled so that any each is influenced substantially equally by a change in ambient temperature. In some embodiments, the two APDs are monolithically integrated on the same die. In some embodiments, the two APDs are adjacent photodiodes that were fabricated at the same time on the same wafer. In some embodiments, the two APDs are formed on different die, each of which is disposed on a thermally conductive substrate. In some embodiments, the two APDs are partially electrically isolated from each other. In some embodiments, the two APDs are substantially completely electrically isolated from each other.

In some embodiments, the second APD comprises a shield that inhibits absorption of light by the second APD—specifically the active region of the second APD. IN some embodiments, this shield substantially blocks light from reaching the active region of the APD. In some embodiments the shield is a solid electrical contact that is disposed over the active region. In some embodiments, a layer of substantially opaque material, such as epoxy or lacquer, is disposed over the active region. In some embodiments, the shield is a layer disposed on the active region that reflects incident light.

An embodiment of the present invention comprises: a receiver comprising a first APD having a first breakdown voltage, and a second APD having a second breakdown voltage, wherein the first APD and the second APD are thermally coupled, and wherein the second breakdown voltage provides an indication of the first breakdown voltage, and further wherein the first APD is biased with a first bias voltage that is based on the second breakdown voltage.

BRIEF DESCRIPTION OF THE DRAWINGS

FIG. 3 depicts a schematic drawing of a cross-sectional view of APDs 102 and 202 in accordance with the illustrative embodiment of the present invention.

FIG. 4 depicts operations of a method for detecting an optical signal in accordance with the illustrative embodiment of the present invention.

DETAILED DESCRIPTION

Figure 1:
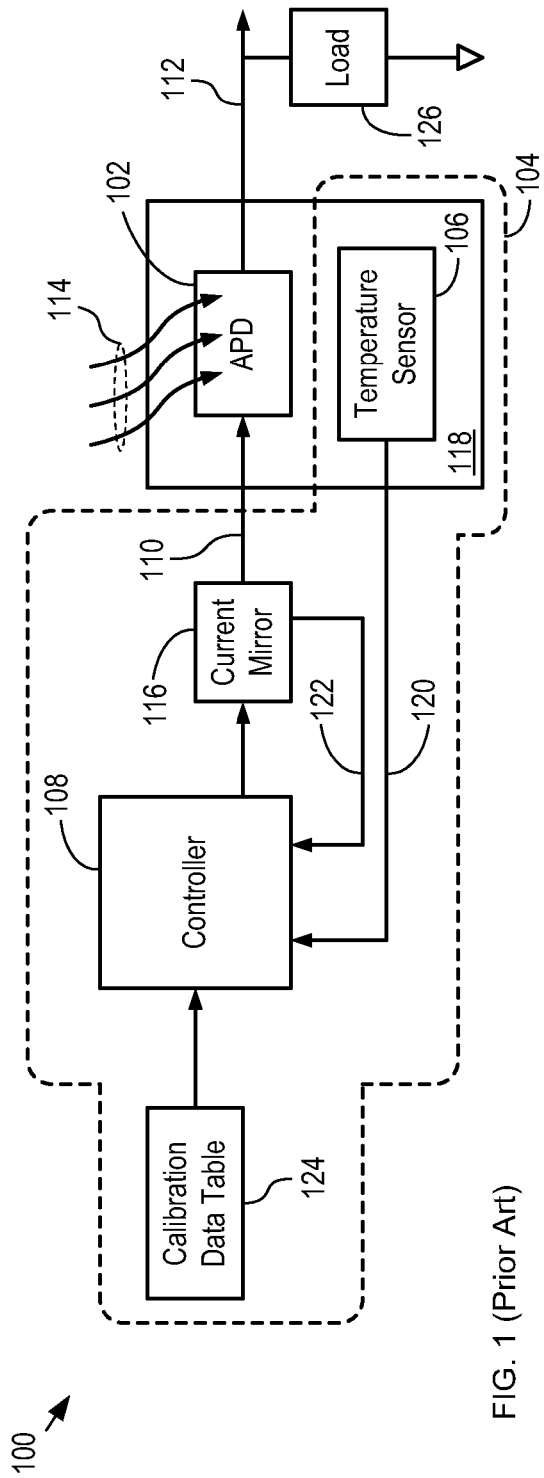
FIG. 1 depicts a schematic diagram of an optical receiver in accordance with the prior art.

FIG. 1 depicts a schematic diagram of an optical receiver in accordance with the prior art. Optical receiver 100 comprises APD 102, temperature compensation circuit 104 and load 126.

APD 102 is a conventional indium-phosphide-based avalanche photodiode designed for operation within the wavelength range of approximately 1000 nm to 1700 nm. APD 102 generates electrical output signal 112 in response to incident light signal 114. The gain of APD 102 is determined by the voltage with which it is biased. For the purposes of this Specification, including the appended claims, "bias voltage" is defined as the voltage potential induced between the cathode contact and anode contact of an APD. Electrical output signal 112, therefore, is based on the intensity of light signal 114 and voltage 110. Moreover, for the purposes of this Specification, including the appended claims, "offset voltage" is defined as the difference in voltage potential between the bias voltage and APD breakdown voltage, reflecting both direction and magnitude, such that a negative, non-zero offset voltage represents a bias voltage below breakdown voltage and a positive non-zero offset voltage represents a bias voltage above breakdown voltage. Output signal 112 is monitored by load 126 and is processed in a manner appropriate to the application of the APD. The load may be a plurality of electrical components used to infer information from output signal 112. The functionality of the load is independent to the proper operation of the APD.

Voltage 110 determines the bias voltage applied to APD 102. APD 102 receives voltage 110 from controller 108. In order to operate at high gain, controller 108 biases APD 102 with a bias voltage that is very close to its breakdown voltage.

Since the gain and breakdown voltage of APD 102 are sensitive to temperature, optical receiver 100 includes temperature compensation circuit 104. Temperature compensation circuit 104 controls the magnitude of voltage 110 to maintain stable operation of APD 102 as its temperature changes. Temperature compensation circuit 104 comprises temperature sensor 106, controller 108, and current mirror 116. In some prior-art receivers, in-line current monitoring is not included.

In order to maintain the desired operational characteristics of APD 102, controller 108 controls voltage 110 based on temperature signal 120, current mirror signal 122, and a relationship between the breakdown voltage of APD 102 and its temperatures. A model of this relationship is stored in calibration table 124.

Controller 108 receives temperature signal 120 from temperature sensor 106. Temperature sensor 106 and APD 102 are co-located on thermally conductive carrier 118. As a result, carrier 118 thermally couples APD 102 and temperature sensor 106 such that temperature signal 120 of temperature sensor 106 approximates the temperature of APD 102. A temperature of APD 102, therefore, is inferred from temperature output 120 of temperature sensor 106.

Controller 108 receives current mirror signal 122 from current mirror 116 at a second input. Current mirror signal 122 is proportional to the current 110 which comprises dark current and photocurrent generated by APD 102 and is proportional to the gain of APD 102.

The model for the relationship between the gain and breakdown voltage of APD 102, which is stored in calibration data table 124, is typically developed by means of a calibration procedure.

In some cases, the model is based on measurements of breakdown voltages of APD 102 itself at a few inferred temperatures. In some cases, the model is based on measurements of breakdown voltages of a representative APD of the same wafer from which APD 102 was obtained. In order to develop a relationship between temperature and breakdown voltage at other temperatures, a simple, linear slope for the relationship is assumed.

In some cases, at each temperature (as measured by temperature sensor 106), controller 108 controls the magnitude of bias voltage 116 until an abrupt change in current mirror signal 122 is detected. This abrupt change in current mirror signal 122 implies an occurrence of an avalanche breakdown of APD 102. The value for the bias voltage 116 at which avalanche breakdown occurred is then stored in calibration data table 124 along with its associated temperature. This process is repeated for each of the different temperatures. Interpolation and/or extrapolation are then used to further estimate the relationship between temperature and the breakdown voltage of APD 102.

There are four primary flaws with the procedures commonly used in the prior art for developing the relationship between temperature and breakdown voltage for an APD:

i. The simplified linear relation is applicable over a limited range of temperature. Operating outside of the range invalidates the approximation and may produce inaccurate results.

ii. The relationship between temperature and breakdown voltage might be measured by the APD vendor or the user, but the determination requires a number of measurements at different temperatures. Because of the complexity and tediousness of the measurement, this linear behavior is measured on a representative set of APDs and assumed to be valid for all other APDs from the same wafer. This assumption often results in errors.

iii. These methods account only for variation due to temperature changes. They do not allow for other factors that change breakdown voltage, such as device aging.

iv. These methods trying to account for change in breakdown voltage by monitoring the current in the operational APD, but cannot differentiate the difference is APD current due to change in breakdown voltage or the presence of optical signal.

In order to provide an operational safety margin, prior-art optical receivers such as optical receiver 100 are typically operated at lower gain than otherwise desired. Operation at reduced gain mitigates some the effects of these flaws, but at the cost of reduced performance.

Figure 2:
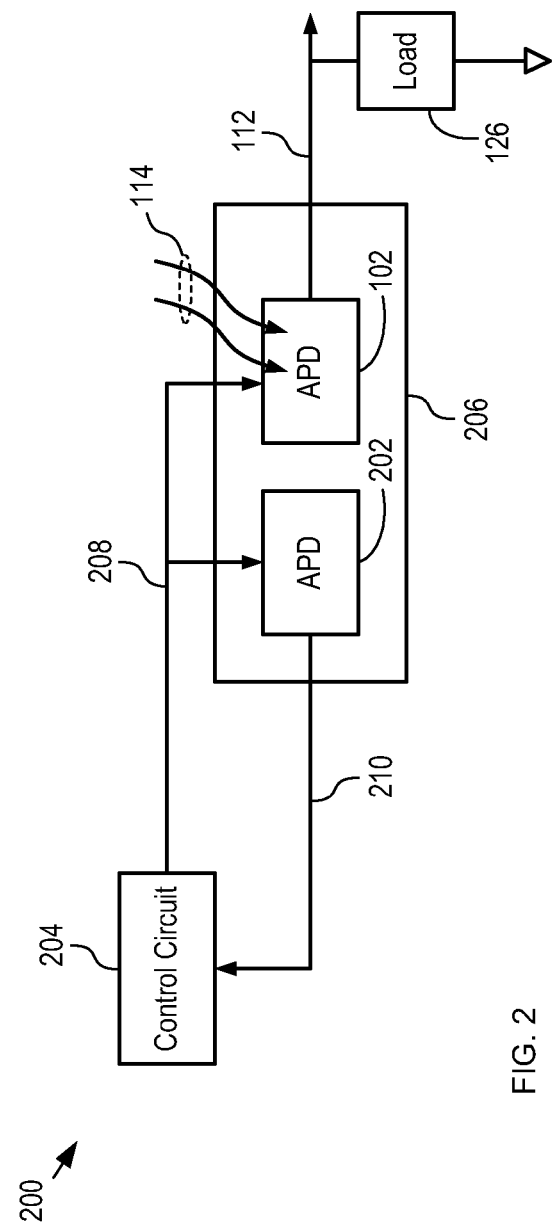
FIG. 2 depicts a schematic diagram of an optical receiver in accordance with an illustrative embodiment of the present invention.

FIG. 2 depicts a schematic diagram of an optical receiver in accordance with an illustrative embodiment of the present invention. Optical receiver 200 comprises APD 102, APD 202, and control circuit 204. Optical receiver 200 is typically expected to be operable over a temperature range from approximately −40° C. to approximately +80° C. One skilled in the art will recognize, after reading this specification, that the principles of the present invention are temperature independent; therefore, it will be clear to one skilled in the art, after reading this specification, how to specify, make, and use embodiments of the present invention that operate over any temperature range.

APD 202 is a conventional avalanche photodiode that is analogous to APD 102. APD 102 and APD 202 are avalanche photodiodes selected from a population of APDs fabricated on the same wafer. Further, APD 102 and APD 202 are selected from the same region of the same wafer.

APDs 102 and 202 are sibling-APDs. For the purposes of this Specification, including the appended claims, "sibling-APDs" are defined as APDs having substantially matched operating characteristics (i.e., their operating characteristics are very similar, if not identical). Sibling-APDs have the same history and have been exposed to substantially the same thermal budget, such as heat treatments associated with device burn-in, thermal bonding, epoxy curing, aging, packaging, and the like. As a result, any changes in their respective breakdown voltages due to aging or other factors encountered through all stages of fabrication, testing, and packaging, etc., are also very similar. In some embodiments, sibling-APDs are APDs that have been formed in or on the same wafer. In some embodiments, sibling-APDs are adjacent APDs taken from the same wafer. In some embodiments, sibling-APDs are not neighboring devices taken from the same fabricated wafer but are taken from the same region of the same fabricated wafer. In some embodiments, sibling-APDs are devices from different regions of the same fabricated wafer. In some embodiments, sibling-APDs are devices selected from different fabricated wafers.

It should be noted that it is preferable, but not necessary, for the breakdown voltages of APDs 102 and 202 to match precisely. In some embodiments, a change in breakdown voltage of APD 202 provides an adequate reference for the breakdown voltage of APD 102. Moreover, it is preferable that each of APDs 102 and 202 experience the same effects on the breakdown voltage induced by aging or any other factors encountered through all stages of production, from testing to packaging to application. While this is possible to ensure using two separate but equivalent APDs, it is more easily managed when the APDs are monolithically integrated on one physical chip (i.e., when a single die comprises both of the APDs).

APD 102 and APD 202 are disposed on carrier 206 such that APD 102 and APD 202 are thermally coupled. Since the APDs are thermally coupled, temperature changes affect the temperature of each APD substantially equally. Carrier 206 is analogous to carrier 110.

Carrier 206 electrically isolates APDs 102 and 202. For the purposes of this Specification, including the appended claims, two elements are defined as "electrically isolated" when there exists an electrical resistance of at least 1 MΩ between them. In the illustrative embodiment, APDs 102 and 202 are "completely electrically isolated" from one another. APDs 102 and 202 are defined as completely electrically isolated when both the anodes of APD 102 and APD 202 are electrically isolated from one another and the cathodes of APD 102 and APD 202 are electrically isolated from one another. In some embodiments, APDs 102 and 202 are "partially electrically isolated" from one another. APDs 102 and 202 are defined as "partially electrically isolated" when only the anodes of APDs 102 and 202 or the cathodes of APDs 102 and 202 are electrically isolated from one another.

Control circuit 204 is an electrical circuit for inducing a bias voltage on each of APD 102 and 202 and controlling the bias voltage based on the breakdown voltage of APD 202.

FIG. 3 depicts a schematic drawing of a cross-sectional view of APDs 102 and 202 in accordance with the illustrative embodiment of the present invention.

FIG. 4 depicts operations of a method for detecting an optical signal in accordance with the illustrative embodiment of the present invention. Method 300 begins with operation 401, wherein APD 102 and APD 202 are provided.

APD 102 is a mesa-structure APD configured to receive input light. As a result, APD 102 is referred to as the "active APD." For the purposes of this specification, including the appended claims, an "active APD" is defined as an APD configured to receive light and generate an output signal based on the received light. APD 102 comprises mesa 302, active region 304, substrate 306, and contacts 308 and 310.

APD 102 is defined within substrate 306 by completely or partially etching through the plurality of layers that compose its structure to form mesa 302. Active region 304 is formed in mesa 302 by diffusion of a suitable dopant. The lateral extent of active region 304 defines the lateral extent of the photosensitive region of APD 102.

Contacts 308 and 310 are formed on APD 102 in conventional fashion. Contact 308 is an annulus of metal layers that includes center region 312. The metal layers are removed in center region 312 to enable the absorption of light signal 114 by active region 304.

It will be clear to one skilled in the art how to fabricate APD 102.

APD 202 is also a mesa-structure APD; however APD 202 is configured so that it can not receive incident light. As a result, APD 202 is referred to as the "dark APD." For the purposes of this specification, including the appended claims, a "dark APD" is defined as an APD that is dimensioned and arranged so that it does not generate an output signal in response to received light. In some cases, a dark APD is dimensioned and arranged so that it does not receive light. APD 202 comprises mesa 314, active region 316, substrate 318, and contacts 320 and 322. APD 202 is analogous to APD 102.

In contrast to APD 102, APD 202 includes contact 320, which is formed on APD 202 such that it blocks light signal 114 from reaching active region 316. Contact 320, therefore, is a shield that inhibits absorption of light signal 114 by APD 202. As a result, APD 202 does not generate photocurrent and the output of APD 202 is equal to its dark current even when illuminated by light signal 114.

It should be noted that in some embodiments, light signal 114 is directed away from APD 202 and it is not necessary to disable the absorption of light by active area 316. In most embodiments, however, it is preferable to mask active area 316 to preclude APD 202 from absorbing light from extraneous sources, scattered light, or misdirected light.

APDs 102 and 202 are mounted on carrier 206, which thermally couples and electrically isolates the two APDs. Carrier 206 comprises independent electrically conductive traces (not shown for clarity) for providing electrical connectivity for each of APDs 102 and 202.

Although the illustrative embodiment comprises APDs that are mesa-structure APDs, it will be clear to one skilled in the art, after reading this specification, how to specify, make, and use alternative embodiments of the present invention that comprise at least one APD having a different type of APD structure. APD structures suitable for use in the present invention include, without limitation, mesa-structure APDs, planar diffusion-defined APDs, metal-resistor-semiconductor APDs, Geiger-mode APDs, and negative feed-back APDs.

Further, although the illustrative embodiment comprises APDs suitable for front-illumination (i.e., wherein light signal 114 is incident directly onto active region 304), it will be clear to one skilled in the art, after reading this specification, how to specify, make, and use alternative embodiments of the present invention comprising at least one APD suitable for back-illumination (i.e., wherein light signal 114 is incident on and passes substantially losslessly through substrate 306).

Still further, it should be noted that although the illustrative embodiment comprises an optical receiver comprising a single pair of APDs (i.e., one active APD and one dark APD), some embodiments of the present invention (e.g., differential receivers, focal plane arrays, etc.) comprise more than a single pair of APDs. One skilled in the art will recognize, after reading this specification, that embodiments of the present invention can comprise:

i. a plurality of active APDs and a single dark APD, wherein the bias voltage applied to each of the active APDs is based on the breakdown voltage of the dark APD; or ii. a plurality of active APDs and a plurality of dark APDs, wherein the breakdown voltage of each dark APD is used as the basis for a bias voltage of at least one of the plurality of active APDs; or iii. a plurality of pairs of APDs, wherein each pair of APDs comprises one active APD and one dark APD, and wherein the bias voltage applied to the active APD is based on the breakdown voltage of the dark APD; or iv. any combination of i, ii, and iii.

At operation 402, control circuit 204 provides voltage 208 to APDs 102 and 202. Voltage 208 induces bias voltage Vb1 on APD 102 across cathode contact 308 and anode contact 310. In similar fashion, voltage 208 induces bias voltage Vb2 on APD 202 across cathode contact 320 and anode contact 322.

At operation 403, feedback signal 210 is provided to control circuit 204. Feedback signal 210 provides control circuit 204 with an indication of the breakdown voltage of APD 202. For the purposes of this Specification, including the appended claims, "breakdown voltage" is defined as the magnitude of bias voltage that induces a specified threshold level of dark current in an APD. In the illustrative embodiment, this threshold level is specified as 1 microampere (μA). One skilled in the art will recognize that a desired threshold level of dark current is dependent upon many factors, such as receiver design, APD device design, and APD material system, etc. As a result, it will be clear to one skilled in the art, after reading this specification, how to specify, make, and use alternative embodiments of the present invention wherein breakdown voltage is specified as the magnitude of bias voltage that induces any suitable threshold level of dark current.

Figure 5:
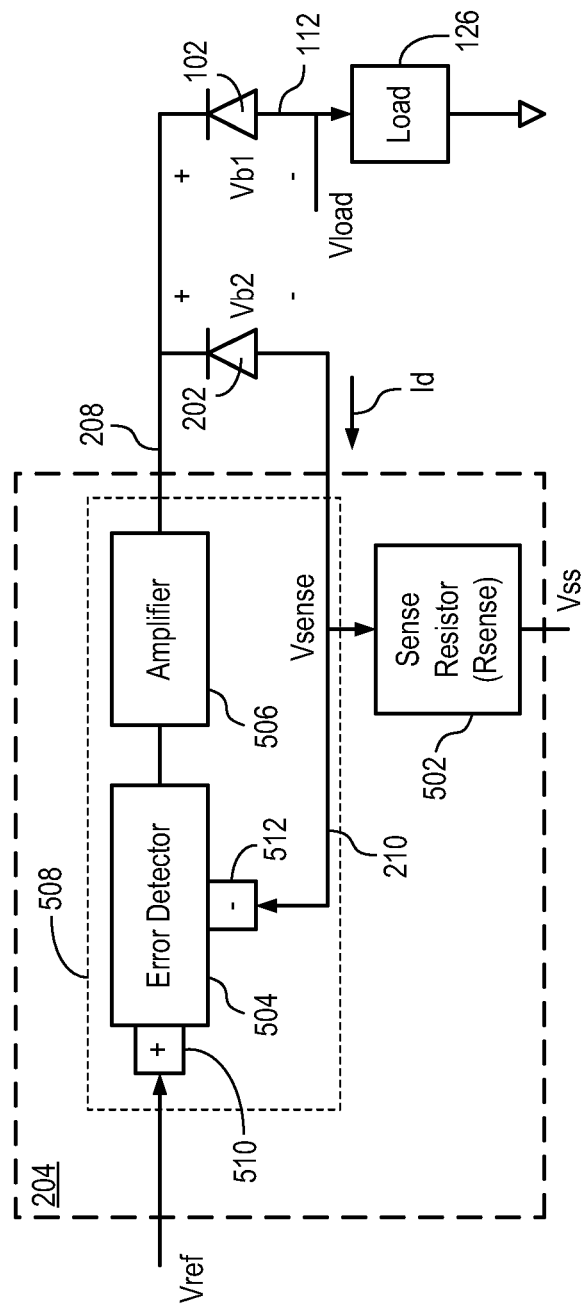
FIG. 5 depicts a schematic drawing of a control circuit in accordance with the illustrative embodiment of the present invention.

FIG. 5 depicts a schematic drawing of a control circuit in accordance with the illustrative embodiment of the present invention. Control circuit 204 comprises sense resistor 502, error detector 504, and amplifier 506. It should be noted that control circuit 204 represents only one example of a control circuit suitable for use with the present invention. It will be clear to one skilled in the art, after reading this specification, how to specify, make, and use alternative embodiments of the present invention wherein control circuit 204 comprises other circuit configurations and/or electrical devices. Devices suitable for use with the present invention include, without limitation, digital microcontrollers, operational amplifiers, field programmable gate arrays, and circuits wherein control over voltage 208 is implemented primarily in software.

Error detector 504 and amplifier 506 collectively define negative-feedback circuit 508, whose output is voltage 208. Error detector 504 comprises positive input 510 and negative input 512. In response to applied voltage 208 (and induced bias voltage Vb2) dark current Id is induced through APD 202. The magnitude of voltage 208 is set such that voltage Vb2 is the breakdown voltage of APD 202; therefore, the magnitude of Id is 1 μA.

Dark current Id is fed back to sense resistor 502 and negative input 512 of error detector 504. Each of the positive input 510 and negative input 512 is characterized by a high input impedance (ideally infinite input impedance). As a result, substantially all of dark current Id flows through sense resistor 502, which results in voltage Vsense (equal to Id*Rsense) being fed back to negative input 512 as feedback signal 210.

As the temperature of APD 202 changes, its breakdown voltage and gain change as well. As a result, the magnitude of Id changes for a given value of voltage 208. As Id begins to change, however, negative-feedback circuit 508 adjusts voltage 208 so that Vsense and Vref are substantially equal and Id remains constant.

The values of Vref, Vss, and Rsense are selected such that the voltage drop across APD 202 is maintained at the selected value of breakdown voltage (in the illustrative embodiment, the voltage that maintains Id substantially equal to 1 μA).

At operation 404, control circuit 204 controls the bias voltage applied to APD 102 based on the breakdown voltage of APD 202, as determined by the value of Vref. The selection of Vref is based on knowledge of the desired offset voltage and without a priori knowledge of the breakdown voltage of either APD 102 or 202. The selection of Vref is further based on knowledge of the value of Vload such that Vref is the sum of the offset voltage and Vload.

In some cases, for normal operation of load 126, a voltage Vload, on which signal 112 is carried, is imposed or required. In some cases, for convenience of the control circuit 204, Vload is made to be non-zero. In some cases, Vload is simply zero volts. In some cases, Vload is a positive voltage. In some case, Vload is a negative voltage.

Although the illustrative embodiment comprises an APD that operates at a bias voltage below its breakdown voltage, it will be clear to one skilled in the art, after reading this specification, how to specify, make, and use alternative embodiments of the present invention comprising an APD that is biased at or above its breakdown voltage.

Since APD 102 and APD 202 are thermally coupled as well as sibling-APDs, the breakdown voltage of APD 102 substantially tracks the breakdown voltage of APD 202 as it changes with temperature, aging, or other factors. By virtue of applied voltage Vref (which comprises the desired offset voltage), therefore, the gain of APD 102 is held substantially constant.

At operation 405, APD 102 receives light signal 114 and generates output signal 112. The value of output signal 112 is based on the intensity of light signal 114 and the gain of APD 102.

Figure 6:
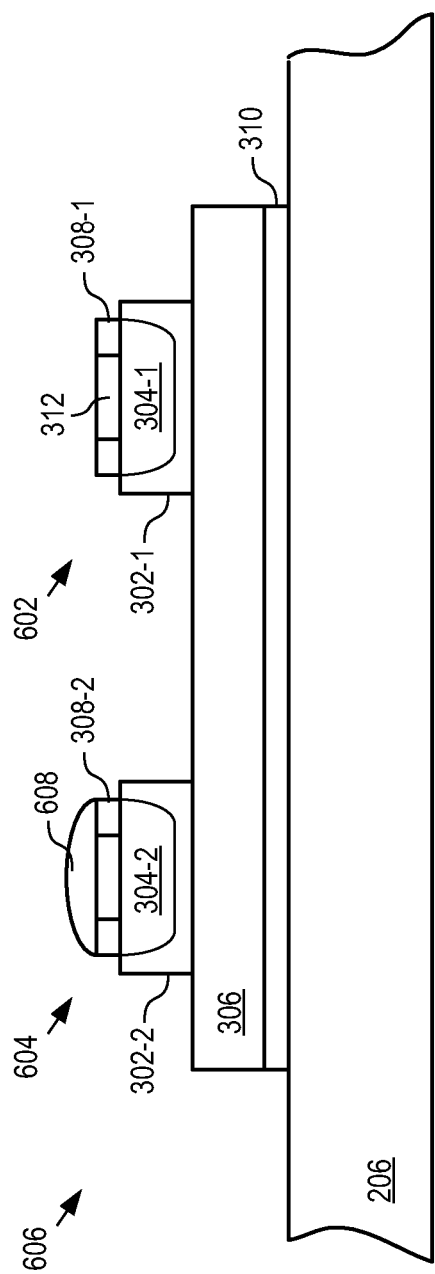
FIG. 6 depicts a cross-sectional view of an active APD and dark APD pair in accordance with an alternative embodiment of the present invention.

FIG. 6 depicts a cross-sectional view of an active APD and dark APD pair in accordance with an alternative embodiment of the present invention. APDs 602 and 604 are each analogous to APD 102. APDs 602 and 604 are monolithically integrated on the same substrate (i.e., substrate 306). In other words, die 606 is a single die that comprises both an active APD and a dark APD. Since APD 102 and APD 202 are monolithically integrated on a single die, the two APDs are thermally coupled primarily, if not completely, through substrate 306. In some embodiments, each of substrate 306 and carrier 206 provide some thermally coupling between the APDs. In addition, substrate 306 electrically couples the anodes of APDs 602 and 604. As a result, APDs 602 and 604 are partially electrically coupled.

APD 604 operates as a dark APD by virtue of shield 608. Shield 608 is a layer of material that is substantially opaque for light within the wavelength range for which APD 602 is operable. Materials suitable for use in shield 608 include, without limitation, epoxies, inks, lacquers, and the like. In some embodiments, shield 608 absorbs incident light to protect active area 304-2. In some embodiments, shield 608 reflects light to protect active area 304-2.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. An apparatus comprising:
a first APD having a first breakdown voltage; and
a second APD having a second breakdown voltage;
wherein the first APD and the second APD are thermally coupled, and wherein the second breakdown voltage provides an indication of the first breakdown voltage, and further wherein the first APD is biased with a first bias voltage that is based on the second breakdown voltage.

2. The apparatus of claim 1 further comprising a circuit, wherein the circuit provides the first bias voltage to the first APD, and wherein the circuit controls the first bias voltage based on the second breakdown voltage.

3. The apparatus of claim 1 further comprising a substrate, wherein the substrate thermally couples the first APD and the second APD.

4. The apparatus of claim 3 wherein the first APD, the second APD, and the substrate are monolithically integrated.

5. The apparatus of claim 1 wherein the second APD comprises an active region, and wherein the second APD is dimensioned and arranged to inhibit absorption of light by the active region.

6. The apparatus of claim 1 wherein the first breakdown voltage and the second breakdown voltage are substantially equal.

7. The apparatus of claim 1 wherein the first bias voltage and the second breakdown voltage differ by an offset voltage that is substantially constant over a first temperature range.

8. The apparatus of claim 1 wherein the first APD and second APD are sibling-APDs.

9. A apparatus comprising:
a first APD having a first breakdown voltage;
a second APD having a second breakdown voltage, wherein the first APD and second APD are thermally coupled; and
a circuit, wherein the circuit biases the first APD with a first bias voltage that is based on the second breakdown voltage.

10. The apparatus of claim 9 wherein the circuit is dimensioned and arranged to provide a first bias voltage to the first APD and a second bias voltage to the second APD, and wherein the second voltage potential is substantially equal to the second breakdown voltage, and wherein the first voltage potential is less than the second voltage potential by a fixed offset voltage.

11. The apparatus of claim 9 wherein the first APD and the second APD are monolithically integrated.

12. The apparatus of claim 9 wherein the second APD comprises an active region, and wherein the second APD is dimensioned and arranged to inhibit absorption of light by the active region.

13. The apparatus of claim 9 wherein the second APD comprises an active region, and wherein the second APD comprises a shield disposed on the active region, and further wherein the shield is substantially opaque for light having a wavelength within the absorption range of the active region.

14. A method comprising:
applying a first bias voltage to a first APD having a first breakdown voltage; and
controlling the first bias voltage based on a second breakdown voltage, wherein the second breakdown voltage is the breakdown voltage of a second APD, and wherein the first APD and second APD are thermally coupled.

15. The method of claim 14 wherein the first bias voltage is controlled such that the first bias voltage is less than the first breakdown voltage by a substantially fixed amount over a first temperature range.

16. The method of claim 14 further comprising:
providing the first APD;
providing the second APD; and
thermally coupling the first APD and the second APD.

17. The method of claim 14 further comprising providing the first APD and the second APD, wherein the first APD and the second APD are disposed on a substrate, and wherein the substrate is thermally conductive.

18. The method of claim 14 further comprising providing the first APD and the second APD, wherein the first APD and the second APD are monolithically integrated.

19. The method of claim 14 further comprising inhibiting the absorption of light by the second APD.

20. The method of claim 14 further comprising providing a shield that inhibits the generation of a photocurrent by the second APD.

* * * * *